US009356032B2

(12) United States Patent
Mizushima

(10) Patent No.: US 9,356,032 B2
(45) Date of Patent: May 31, 2016

(54) SEMICONDUCTOR DEVICE WITH IMPROVED ELECTRODE ISOLATION

(71) Applicant: RENESAS ELECTRONICS CORPORATION, Kanagawa (JP)

(72) Inventor: Hiroaki Mizushima, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/737,148

(22) Filed: Jun. 11, 2015

(65) Prior Publication Data

US 2015/0364481 A1 Dec. 17, 2015

(30) Foreign Application Priority Data

Jun. 13, 2014 (JP) ................................. 2014-122606

(51) Int. Cl.
| | |
|---|---|
| *H01L 27/115* | (2006.01) |
| *H01L 29/423* | (2006.01) |
| *H01L 21/28* | (2006.01) |
| *H01L 29/788* | (2006.01) |

(52) U.S. Cl.
CPC .... *H01L 27/11521* (2013.01); *H01L 21/28273* (2013.01); *H01L 27/11531* (2013.01); *H01L 29/42328* (2013.01); *H01L 29/7881* (2013.01)

(58) Field of Classification Search
None
See application file for complete search history.

(56) References Cited

U.S. PATENT DOCUMENTS

| | | | | |
|---|---|---|---|---|
| 6,091,104 A * | 7/2000 | Chen | .............................. | 257/326 |
| 6,747,310 B2 * | 6/2004 | Fan et al. | ...................... | 257/320 |
| 6,867,082 B2 * | 3/2005 | Kim et al. | ..................... | 438/201 |
| 7,652,318 B2 * | 1/2010 | Hsieh et al. | ................... | 257/315 |
| 7,834,390 B2 * | 11/2010 | Nagai | .............................. | 257/319 |
| 7,851,846 B2 * | 12/2010 | Do et al. | ....................... | 257/320 |
| 8,093,649 B2 * | 1/2012 | Lin et al. | ....................... | 257/319 |
| 8,421,141 B2 * | 4/2013 | Hsu et al. | ...................... | 257/315 |
| 2009/0039410 A1 | 2/2009 | Liu et al. | | |
| 2014/0091382 A1 * | 4/2014 | Tadayoni et al. | ............. | 257/320 |
| 2015/0263123 A1 * | 9/2015 | Cheng et al. | .......... | H01L 29/517 |

FOREIGN PATENT DOCUMENTS

| | | |
|---|---|---|
| JP | 2008-085102 A | 4/2008 |
| JP | 2009-044164 A | 2/2009 |
| JP | 2012-222201 A | 11/2012 |

* cited by examiner

*Primary Examiner* — Scott B Geyer
(74) *Attorney, Agent, or Firm* — McDermott Will & Emery LLP

(57) ABSTRACT

A floating gate insulating film is formed in a first element formation region of a substrate. A first insulating film and a control gate electrode are continuously formed from the first element formation region to a first element isolation film. A selection gate insulating film and a selection gate electrode are formed in the substrate located in the first element formation region. The selection gate electrode is continuously formed over the first element isolation film. A side surface of the selection gate electrode is in contact with a first side surface of a floating gate electrode through a second insulating film. An upper surface of a region overlapping with the selection gate electrode in the first element isolation film is located lower than an upper surface of the substrate.

6 Claims, 20 Drawing Sheets

SEMICONDUCTOR DEVICE WITH IMPROVED ELECTRODE ISOLATION

CROSS-REFERENCE TO RELATED APPLICATIONS

The disclosure of Japanese Patent Application No. 2014-122606 filed on Jun. 13, 2014 including the specification, drawings and abstract is incorporated herein by reference in its entirety.

BACKGROUND

Technical Field

The present invention relates to a semiconductor device. For example, the present invention is a technique that can be applied to a semiconductor device including a non-volatile memory.

A non-volatile memory is a kind of memory. There is anon-volatile memory in which, for example, as described in Japanese Unexamined Patent Application Publication No. 2009-41164 and Japanese Unexamined Patent Application Publication No. 2012-222201, a floating gate insulating film, a floating gate electrode, a control gate insulating film, and a control gate electrode are laminated and the laminated material of these films and electrodes and a selection gate electrode are arranged abreast with an insulating film in between. Japanese Unexamined Patent Application Publication No. 2009-41164 describes that a part of an erase gate electrode of the non-volatile memory is overhung over the floating gate electrode. Japanese Unexamined Patent Application Publication No. 2012-222201 describes that, in a manufacturing process of the non-volatile memory, to prevent the floating gate insulating film from being side-etched, the lower end of the insulating film located between the laminated material and the selection gate electrode is located lower than the upper surface of the floating gate insulating film. Japanese Unexamined Patent Application Publication No. 2012-222201 describes that the floating gate electrode and the selection gate electrode may be close to each other when the floating gate insulating film is side-etched.

Japanese Unexamined Patent Application Publication No. 2008-85102 describes that, to suppress variation of parasitic capacitance generated between the floating gate electrode and the control gate electrode, the upper surface of an element isolation film located between adjacent floating gate electrodes is located lower than the floating gate electrodes.

SUMMARY

As described in Japanese Unexamined Patent Application Publication No. 2012-222201, when the floating gate insulating film is side-etched, the floating gate electrode and the selection gate electrode may be close to each other. Japanese Unexamined Patent Application Publication No. 2012-222201 is to prevent a region of an end surface of the floating gate insulating film, which faces the selection gate electrode, from being etched. On the other hand, as a result of a study of the inventors, it is found that, in the end surface of the floating gate insulating film, a portion facing a portion where an edge of the element isolation film and the selection gate electrode overlap with each other may be etched. When the portion is etched, a possibility occurs where the floating gate electrode and the selection gate electrode come close to each other and a withstand voltage between these electrodes decreases. The other purposes and new features will become clear from the description of the present specification and the accompanying drawings.

According to an embodiment, a first element isolation film is formed in a substrate. The first element isolation film is located adjacent to a first element formation region. A floating gate insulating film, a floating gate electrode, a first insulating film, and a control gate electrode are laminated in this order over the substrate located in the first element formation region. The first insulating film and the control gate electrode are continuously formed from the first element formation region to the first element isolation film. A selection gate insulating film and a selection gate electrode are formed in the substrate located in the first element formation region. The selection gate electrode is continuously formed over the first element isolation film. A side surface of the selection gate electrode is in contact with a first side surface of the floating gate electrode through a second insulating film. An upper surface of a region overlapping with the selection gate electrode in the first element isolation film is located lower than an upper surface of the substrate.

According to the embodiment, even when, in the end surface of the floating gate insulating film, a portion facing a portion where an edge of the element isolation film and the selection gate electrode overlap with each other is etched, it is possible to suppress the decrease in the withstand voltage between the floating gate electrode and the selection gate electrode.

DETAILED DESCRIPTION

Hereinafter, an embodiment will be described with reference to the drawings. In all the drawings, the same symbol is attached to the same component and the description is appropriately omitted.

Figure 1:
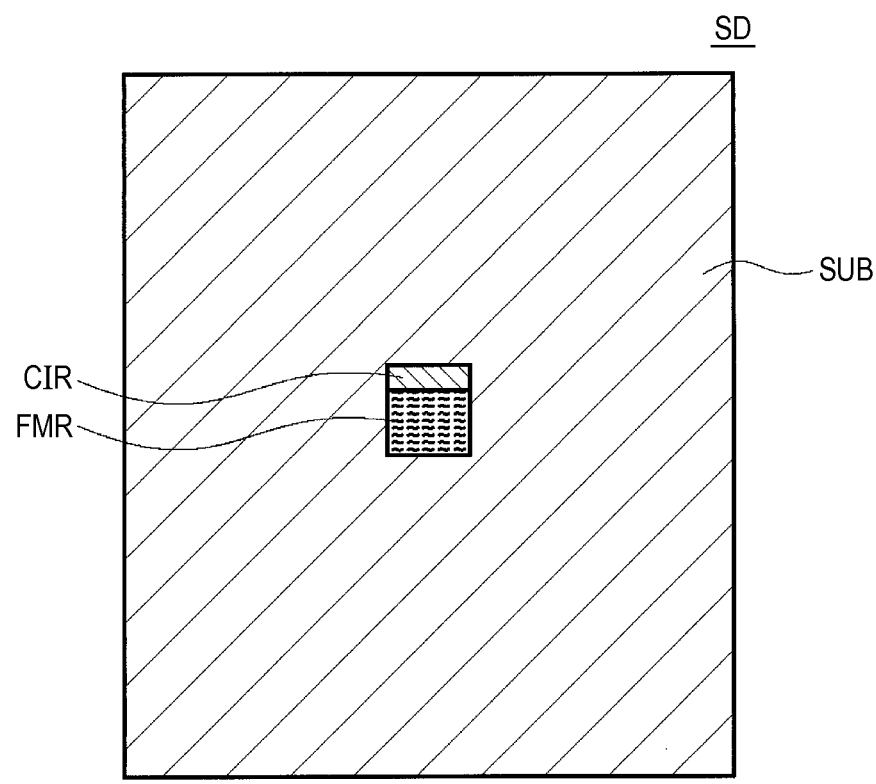
FIG. 1 is a plan view of a semiconductor device according to an embodiment.

FIG. 1 is a plan view of a semiconductor device SD according to the embodiment. The semiconductor device SD is formed by using a substrate SUB and includes a non-volatile memory region FMR and a peripheral circuit region CIR. The substrate SUB is a semiconductor substrate such as, for example, a silicon substrate. A non-volatile memory is formed in the non-volatile memory region FMR and a peripheral circuit of the non-volatile memory is formed in the peripheral circuit region CIR. The peripheral circuit is a circuit that controls the non-volatile memory and is formed by using a transistor.

The semiconductor device SD may include a region where a logic circuit is formed besides the peripheral circuit region CIR and the non-volatile memory region FMR. The semiconductor device SD may further include a region where an SRAM is formed and a region where a DRAM is formed.

Figure 2:
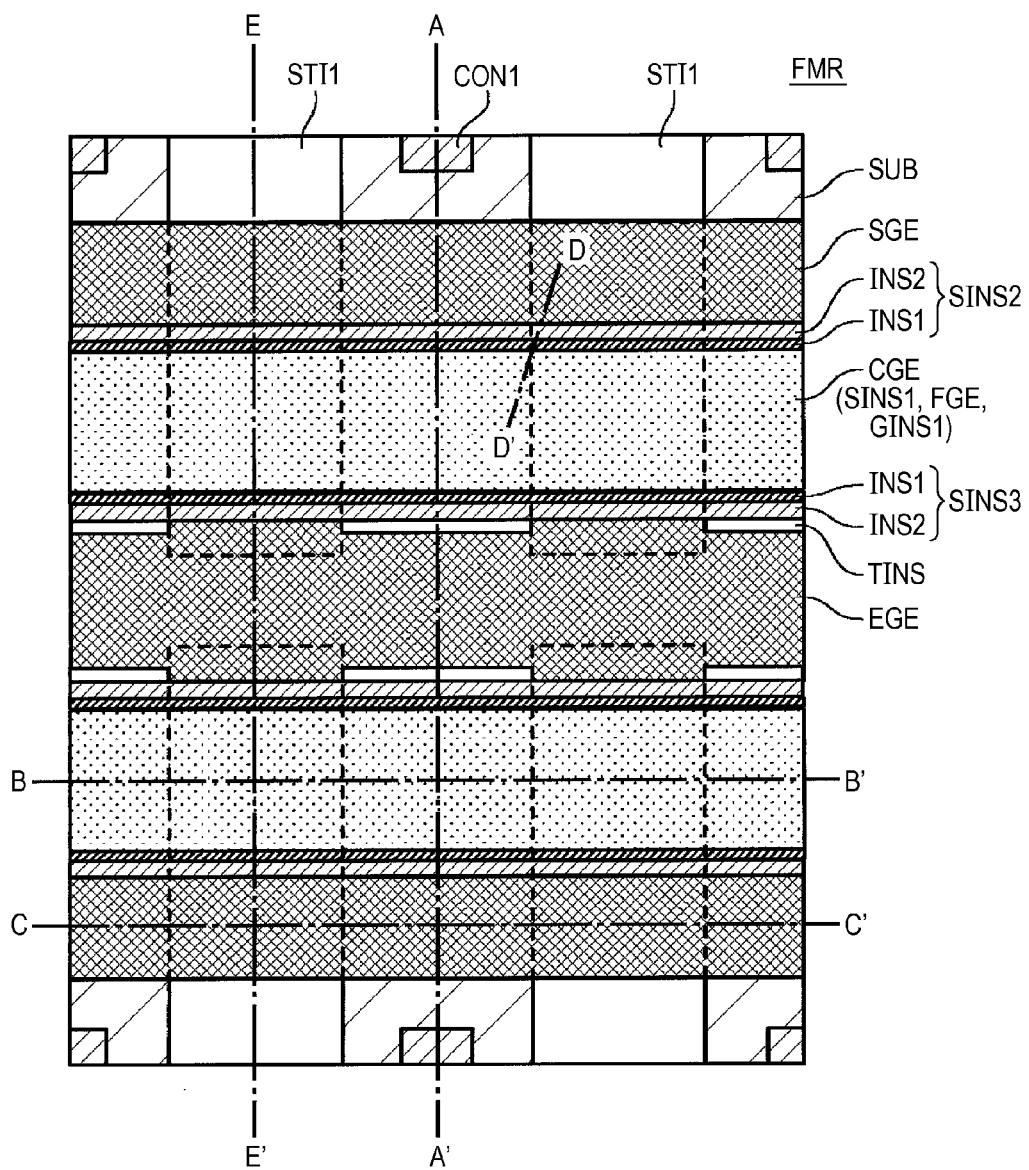
FIG. 2 is a plan view of a non-volatile memory provided in a non-volatile memory region.
Figure 3:
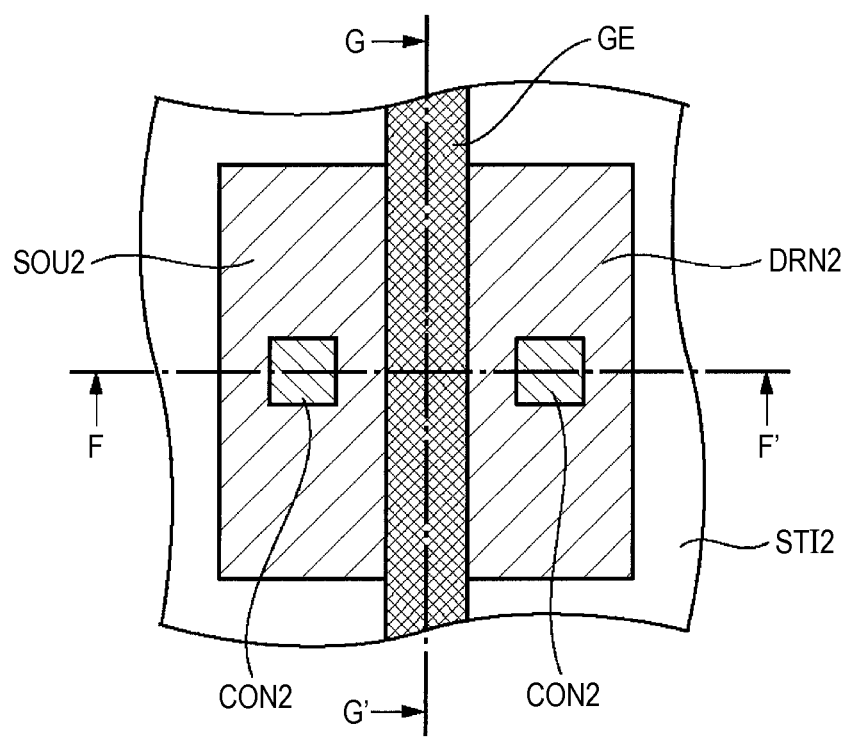
FIG. 3 is a plan view of a transistor provided in a peripheral circuit region.
Figure 4:
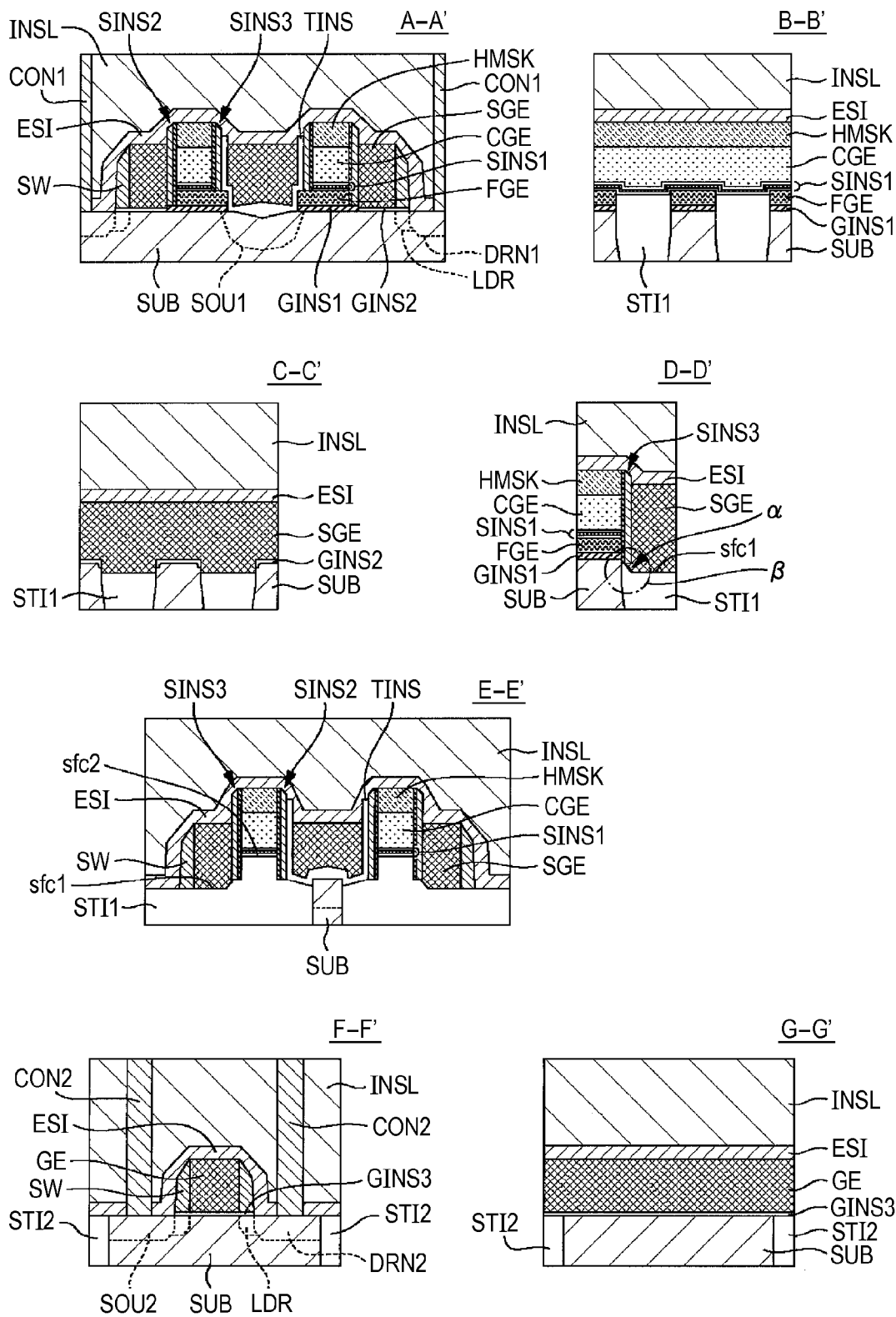
FIG. 4 is a diagram showing each of an A-A' cross section, a B-B' cross section, a C-C' cross section, a D-D' cross section, and an E-E' cross section of FIG. 2 and an F-F' cross section and a G-G' cross section of FIG. 3.

FIG. 2 is a plan view of the non-volatile memory provided in the non-volatile memory region FMR. FIG. 3 is a plan view of the transistor provided in the peripheral circuit region CIR. FIG. 4 is a diagram showing each of an A-A' cross section, a B-B' cross section, a C-C' cross section, a D-D' cross section, and an E-E' cross section of FIG. 2 and an F-F' cross section and a G-G' cross section of FIG. 3. The non-volatile memory is a split gate type non-volatile memory.

First, a configuration of the non-volatile memory will be described with reference to FIG. 4 and the A-A' cross-sectional view, the B-B' cross-sectional view, the C-C' cross-sectional view, the D-D' cross-sectional view, and the E-E' cross-sectional view in FIG. 4.

A first element isolation film STI1 is formed in the substrate SUB located in the non-volatile memory region FMR. The first element isolation film STI1 is located in a region adjacent to a region where the non-volatile memory is formed (hereinafter referred to as a first element formation region) in the substrate SUB. In other words, the first element isolation film STI1 isolates a region to be the first element formation region in the substrate SUB from other region. The non-volatile memory includes a floating gate insulating film GINS1, a floating gate electrode FGE, a first insulating film SINS1, a control gate electrode CGE, a selection gate electrode SGE, a second insulating film SINS2, a selection gate insulating film GINS2, a selection gate electrode SGE, a third insulating film SINS3, and an erase gate electrode EGE.

The floating gate insulating film GINS1 is formed over the substrate SUB located in the first element formation region. When the substrate SUB is a silicon substrate, the floating gate insulating film GINS1 is, for example, a thermal oxide film.

The floating gate electrode FGE is continuously formed over the floating gate insulating film GINS1 and the first element isolation film STI1. The floating gate electrode FGE is formed of, for example, polysilicon.

The first insulating film SINS1 is formed over the floating gate electrode FGE. The first insulating film SINS1 is a so-called ONO film that is a film in which, for example, a silicon oxide film, a silicon nitride film, and a silicon oxide film are laminated in this order.

The control gate electrode CGE is formed over the first insulating film SINS1. In other words, the control gate electrode CGE faces the floating gate electrode FGE through the first insulating film SINS1. The control gate electrode CGE is formed of, for example, polysilicon.

The selection gate insulating film GINS2 is formed over the substrate SUB located in the first element formation region and is located adjacent to the floating gate insulating film GINS1. When the substrate SUB is a silicon substrate, the selection gate insulating film GINS2 is, for example, a thermal oxide film.

The selection gate electrode SGE is continuously formed over the selection gate insulating film GINS2 and the first element isolation film STI1. One side surface of the selection gate electrode SGE is in contact with one side surface (first side surface) of the floating gate electrode FGE through the second insulating film SINS2. The selection gate electrode SGE is formed of, for example, polysilicon.

The second insulating film SINS2 has a configuration in which an insulating film INS1 and an insulating film INS2 is laminated in this order over the first side surface of the floating gate electrode FGE. The insulating film INS1 is, for example, a silicon oxide film. The insulating film INS2 is formed of a material such as, for example, a silicon nitride film, whose etching selectivity is greater than that of oxide silicon.

The erase gate electrode EGE is in contact with the other side surface (second side surface) of the floating gate electrode FGE through the third insulating film. The floating gate electrode FGE is formed of, for example, polysilicon.

The third insulating film SINS3 has a configuration in which an insulating film INS1 and an insulating film INS2 is laminated in this order over the second side surface of the floating gate electrode FGE. The third insulating film SINS3 is formed by the same process as that of the second insulating film SINS2.

An insulating film TINS is formed between the erase gate electrode EGE and the substrate. The insulating film TINS is, for example, a silicon oxide film, and is also formed over the third insulating film SINS3. The insulating film TINS located over the substrate SUB is thicker than the insulating film TINS located over the third insulating film SINS3.

As shown in the A-A' cross-sectional view in FIG. 4, a source SOU1 is formed in a portion of the substrate SUB located under the erase gate EGE and a drain DRN1 is formed in a portion of the substrate SUB located opposite to the source SOU1 via the selection gate electrode SGE. Both of the source SOU1 and the drain DRN1 are formed by introducing impurities into the substrate SUB.

A side wall SW is formed over a side surface of the selection gate electrode SGE opposite to the second insulating film SINS2. The side wall SW is formed of, for example, a silicon oxide film. A low density impurity region LDR is formed in a region of the substrate SUB located under the side wall SW. The low density impurity region LDR is a region where impurities of the same conductivity type as that of the drain DRN1 are introduced, and is coupled to the drain DRN1. The density of the impurities in the low density impurity region LDR is lower than that of the drain DRN1.

In the example shown in the A-A' cross-sectional view in FIG. 4, two laminated bodies of the floating gate electrode GINS1, the floating gate electrode FGE, the first insulating film SINS1, and the control gate electrode CGE are formed side by side. The erase gate electrode EGE is formed between the two laminated bodies. The second insulating film SINS2 and the selection gate electrode SGE are formed over a side surface of each laminated body opposite to the erase gate electrode EGE. In other words, two non-volatile memories are formed side by side and the two non-volatile memories share the erase gate EGE and the source SOU1.

As shown in the D-D' cross-sectional view and the E-E' cross-sectional view in FIG. 4, an upper surface (first upper surface SFC1) of a portion of the first element isolation film STI1 overlapping with the selection gate electrode SGE is located lower than the upper surface of the substrate SUB. In other words, the portion overlapping with the selection gate electrode SGE in the first element isolation film STI1 is depressed. Thereby, the lower end of the second insulating film SINS2 is located lower than the upper surface of the substrate SUB. Therefore, the upper surface of the substrate SUB is covered by the second insulating film SINS2 in a portion indicated by α in the D-D' cross-sectional view in FIG. 4, that is, a portion where the second insulating film SINS2 and an edge of the first element isolation film STI1 overlap with each other. Thereby, as described later, even when a portion of the first element isolation film STI1 located under the lower end of the second element isolation film STI2 is etched, it is possible to prevent a part of the selection gate electrode SGE from being located near the floating gate electrode FGE.

The portion overlapping with the selection gate electrode SGE in the first element isolation film STI1 is depressed by etching. Therefore, as shown in the E-E' cross-sectional view in FIG. 4, the first upper surface SFC1 is located lower than an upper surface (second upper surface SFC2) of a region of the first element isolation film STI1 overlapping with the control gate electrode CGE.

Next, a configuration of the transistor formed in the peripheral circuit region CIR will be described with reference to FIG. 3 and the F-F' cross-sectional view and the G-G' cross-sectional view in FIG. 4. The transistor is formed in a second element formation region of the substrate SUB. The second element formation region is isolated from the other region of the substrate SUB by the second element isolation film STI2. In other words, the second element isolation film STI2 is located adjacent to the second element formation region. The first element isolation film STI1 and the second element isolation film STI2 may be portions different from each other in the same element isolation film. The aforementioned transistor includes a gate insulating film GINS3, a gate electrode GE, a source SOU2, and a drain DRN2.

The gate insulating film GINS3 is formed in the substrate SUB. The gate insulating film GINS3 is formed by, for example, thermally oxidizing the substrate SUB. The gate electrode GE is located over the gate insulating film GINS3 and is formed of, for example, polysilicon. A part of the gate electrode GE is located over the second element isolation film STI2. Both of the source SOU2 and the drain DRN2 are formed by introducing impurities into the substrate SUB and face to each other via the gate electrode GE.

As shown in the F-F' cross-sectional view in FIG. 4, the side surface of the gate electrode GE is covered by the side wall SW. A low density impurity region LDR is formed in a region of the substrate SUB located under the side wall SW. The configurations of the side wall SW and the low density impurity region LDR are the same as those of the side wall SW and the low density impurity region LDR in the non-volatile memory.

The upper surface of the second element isolation film STI2 is higher than the first upper surface SFC1 of the first element isolation film STI1. The upper surface of a region of the second element isolation film STI2 overlapping with the gate electrode GE is higher than the first upper surface SFC1 of the first element isolation film STI1 and is lower than the second upper surface SFC2.

As shown in each view in FIG. 4, an insulating film ESI, an interlayer insulating film INSL, and contacts CON1 and CON2 are further formed over the substrate SUB.

The contact CON1 is coupled to the drain DRN1 and the contact CON2 is coupled to the source SOU2 (or the drain DRN2) in the peripheral circuit region CIR. A contact coupled to the selection gate electrode SGE, a contact coupled to the control gate electrode CGE, a contact coupled to the erase gate electrode EGE, a contact coupled to the source SOU1, and a contact coupled to the gate electrode GE are further buried in the interlayer insulating film INSL.

The insulating film ESI functions as an etching stopper when forming a coupling hole for burying each contact in the interlayer insulating film INSL. When the interlayer insulating film INSL is a silicon oxide film, the insulating film ESI is, for example, a silicon nitride film or a silicon oxynitride film.

Figure 5:
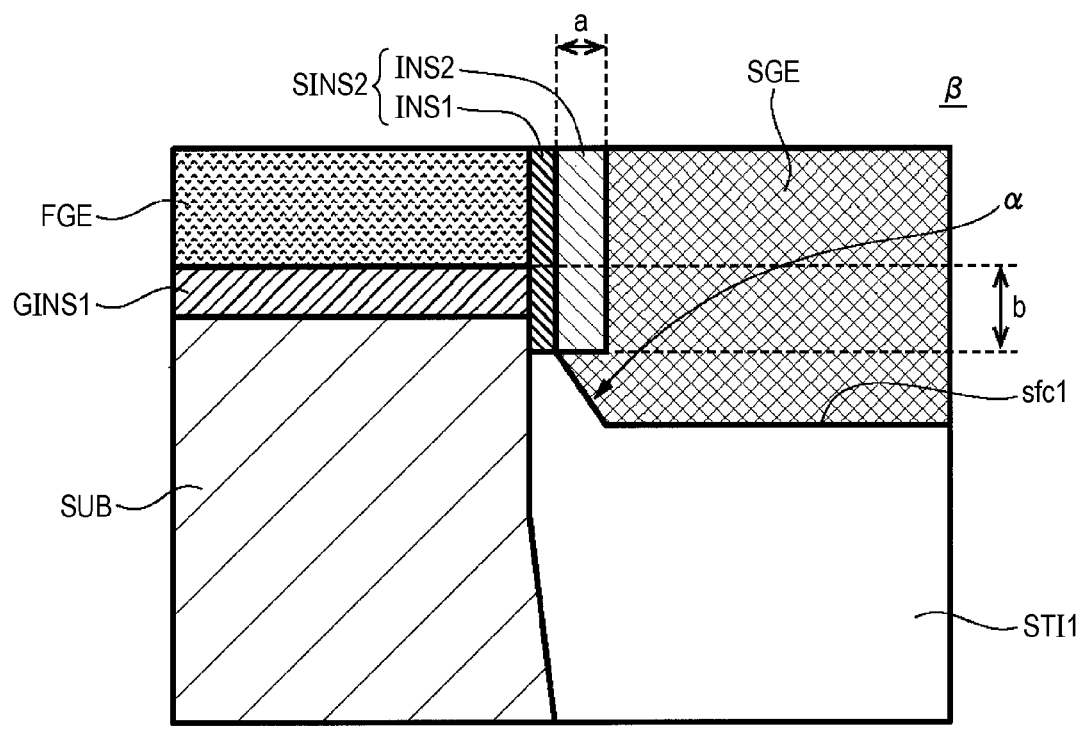
FIG. 5 is an enlarged diagram of a region surrounded by a dashed line β in the D-D' cross-sectional view in FIG. 4.

FIG. 5 is an enlarged diagram of a region surrounded by a dashed line β in the D-D' cross-sectional view in FIG. 4. As described above, the portion overlapping with the selection gate electrode SGE in the first element isolation film STI1 is depressed. The lower end of the second insulating film SINS2 is located lower than the upper surface of the substrate SUB. The distance b from the lower end of the second insulating film SINS2 to the bottom surface of the floating gate electrode FGE is greater than the thickness a of the second insulating film SINS2.

FIGS. 6 to 20 are cross-sectional views for explaining the manufacturing method of the semiconductor device SD and each of FIGS. 6 to 20 corresponds to FIG. 4.

Figure 6:
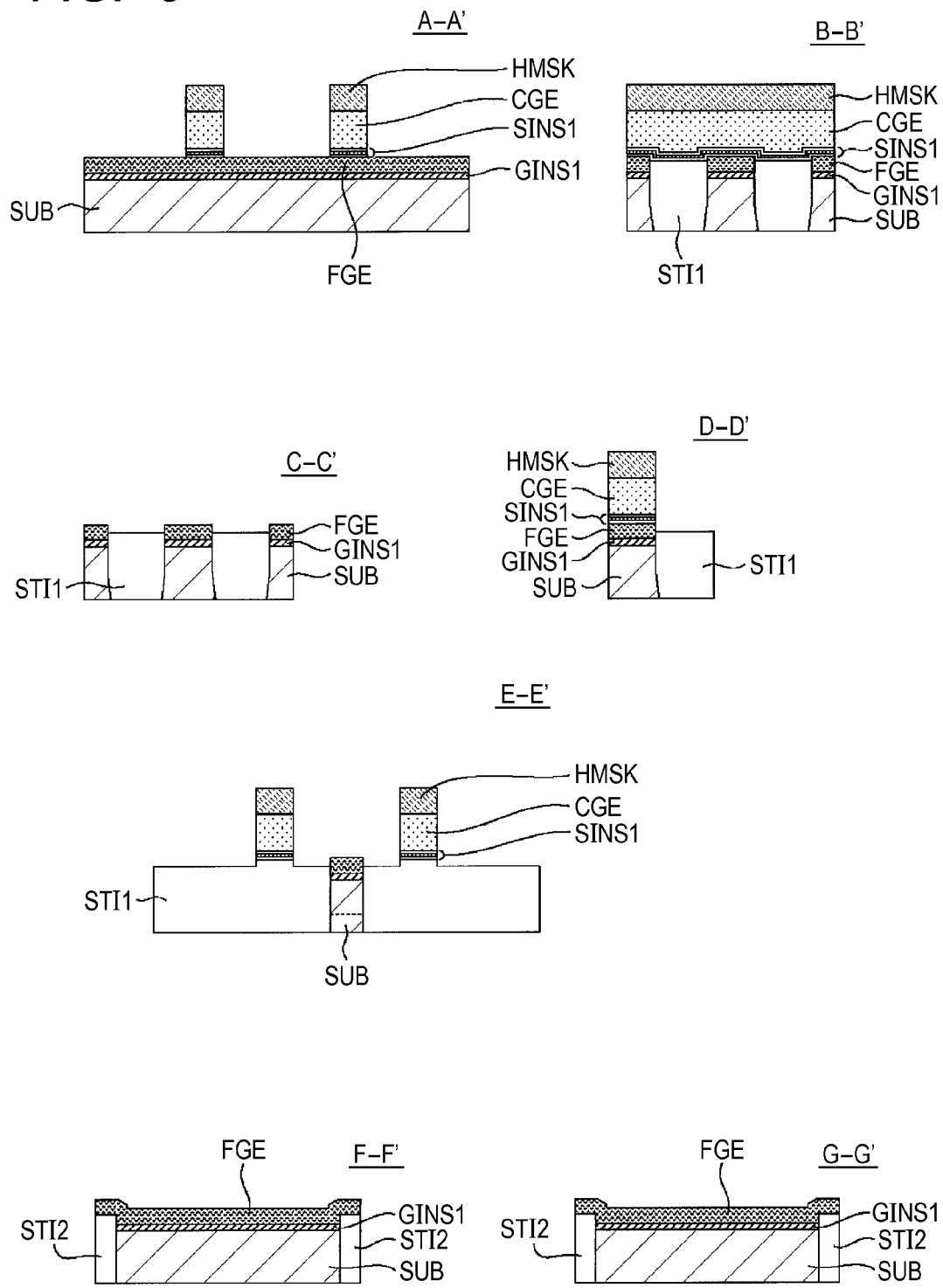
FIG. 6 is cross-sectional views for explaining a manufacturing method of a semiconductor device.

First, as shown in FIG. 6, the substrate SUB is prepared. The substrate SUB is, for example, a silicon substrate. Subsequently, the floating gate insulating film GINS1 is formed over the substrate SUB. When the substrate SUB is a silicon substrate, the floating gate insulating film GINS1 is formed by, for example, a thermal oxidation method.

Subsequently, a conductive film (for example, a polysilicon film) to be the floating gate electrode FGE is formed over the floating gate insulating film GINS1. Subsequently, the floating gate insulating film GINS1 and the conductive film are patterned. Thereafter, a groove is formed in the substrate SUB by using the patterned conductive film (the floating gate electrode FGE) as a mask and an insulating film is formed over the substrate SUB including the inside of the groove. The insulating film is polished by a known CMP method and is buried in the groove, so that the first element isolation film STI1 is formed. At this time, the height of the first element isolation film STI1 is the same as or slightly lower than the height of the upper surface of the floating gate electrode FGE. In other words, the position of the surface of the first element isolation film STI1 is higher than the substrate SUB under the floating gate electrode FGE.

Thereafter, an insulating film to be the first insulating film SINS1, a conductive film (for example, a polysilicon film) to be the control gate electrode CGE, and a hard mask HMSK are formed in this order over the floating gate electrode FGE and the first element isolation film STI1. These films are formed by, for example, a gas phase method. The gas phase method here includes, for example, a CVD method, a sputtering method, and an ALD method. The insulating film to be the first insulating film SINS1 is, for example, an ONO film in which a silicon oxide film, a silicon nitride film, and a silicon oxide film are formed in this order. The hard mask HMSK is, for example, a NON film in which a silicon nitride film, a silicon oxide film, and a silicon nitride film are formed in this order.

Subsequently, a mask pattern (not shown in the drawings) is formed over the hard mask HMSK and anisotropic etching, for example, dry etching having anisotropy, is performed on the hard mask HMSK, the conductive film to be the control gate electrode CGE, and the insulating film to be the first insulating film SINS1 by using the mask pattern as a mask. At this time, the conductive film to be the floating gate electrode FGE functions as an etching stopper. Thereby, the control gate electrode CGE and the first insulating film SINS1 are formed. In the example shown in FIG. 6, two laminated structures of the first insulating film SINS1, the control gate electrode CGE, and the hard mask HMSK (hereinafter referred to as laminated structures) face each other over the conductive film to be the floating gate electrode FGE. Thereafter, the mask pattern is removed if the mask pattern remains.

On the other hand, in this state, as shown in the C-C' cross-sectional view, the D-D' cross-sectional view, and the E-E' cross-sectional view in FIG. 6, the conductive film to be the floating gate electrode FGE is not formed over a region in the first element isolation film STI1 where the selection gate electrode SGE is formed. Therefore, the first element isolation film STI1 located in this region is etched and slightly depressed. On the other hand, as shown in the B-B' cross-sectional view in FIG. 6, a region of the first element isolation film STI1 overlapping with the control gate electrode CGE is not etched. Further, as shown in the F-F' cross-sectional view in FIG. 6, the second element isolation film STI2 is covered by the conductive film to be the floating gate electrode FGE, so that the second element isolation film STI2 is not etched.

Figure 7:
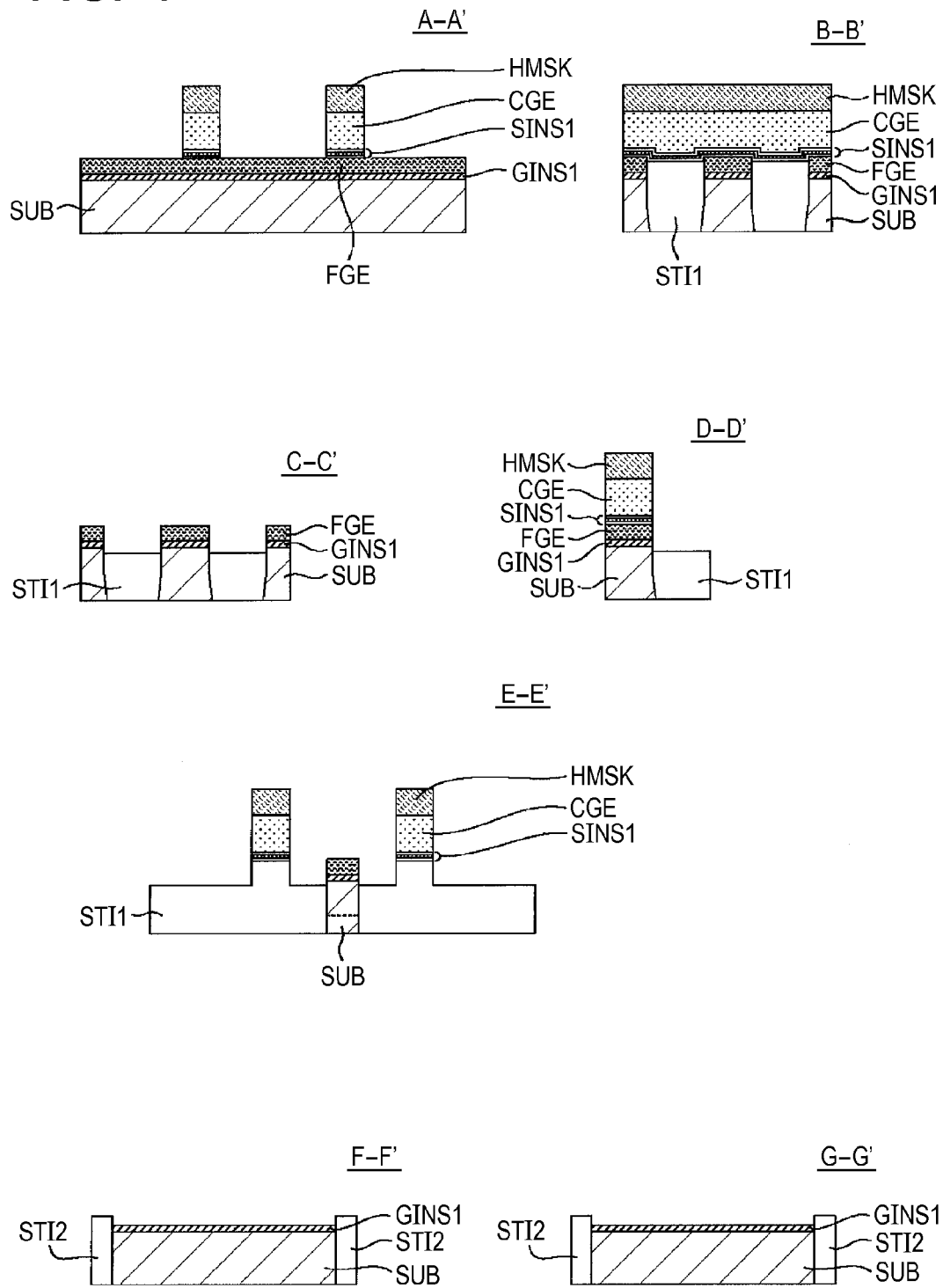
FIG. 7 is cross-sectional views for explaining the manufacturing method of the semiconductor device.

Subsequently, as shown in FIG. 7, anisotropic etching, for example, dry etching is performed in a condition in which the material that forms the first element isolation film STI1 is etched (for example, in a condition in which silicon oxide is etched). Thereby, the region where the selection gate electrode SGE is formed in the first element isolation film STI1 is further depressed. In this stage, the first upper surface SFC1 of the first element isolation film STI1 is sufficiently lower than the upper surface of the substrate SUB and the second upper surface SFC2 of the first element isolation film STI1. The first upper surface SFC1 is lower than the upper surface of the substrate SUB. In this stage, the difference in height between the first upper surface SFC1 and the second upper surface SFC2 is, for example, greater than or equal to 30 nm and smaller than or equal to 100 nm.

Figure 8:
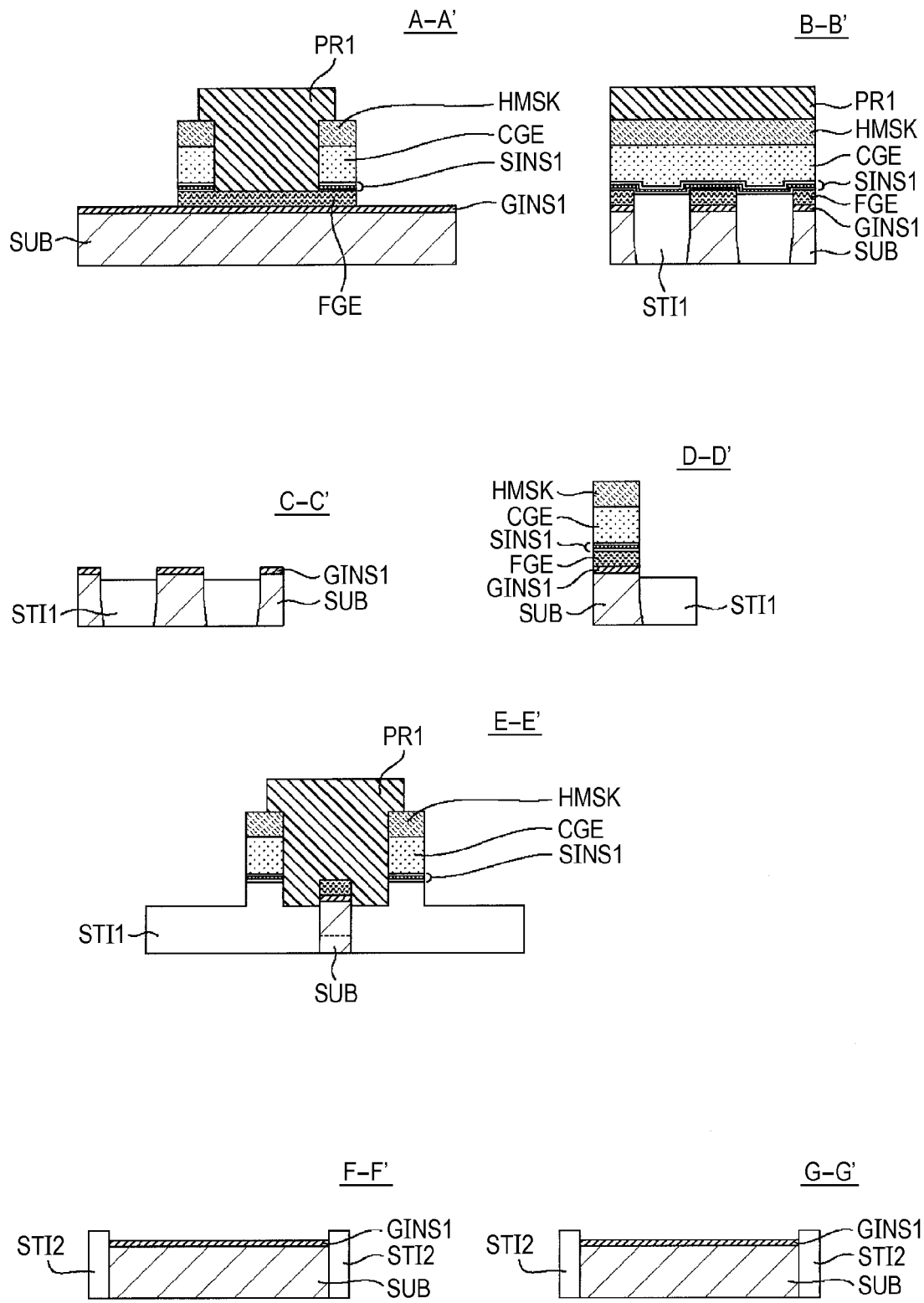
FIG. 8 is cross-sectional views for explaining the manufacturing method of the semiconductor device.

Subsequently, as shown in FIG. 8, the resist pattern PR1 is formed. The resist pattern PR1 covers the conductive film to be the floating gate electrode FGE in a region located between the two laminated structures. Subsequently, anisotropic etching, for example, dry etching having anisotropy, is performed on the conductive film to be the floating gate electrode FGE by using the resist pattern PR1 and the hard mask HMSK as a mask. At this time, the floating gate insulating film GINS1 functions as an etching stopper. Thereby, the conductive film to be the floating gate electrode FGE is removed except for a portion located between the two laminated structure and a portion located under the hard mask HMSK.

Figure 9:
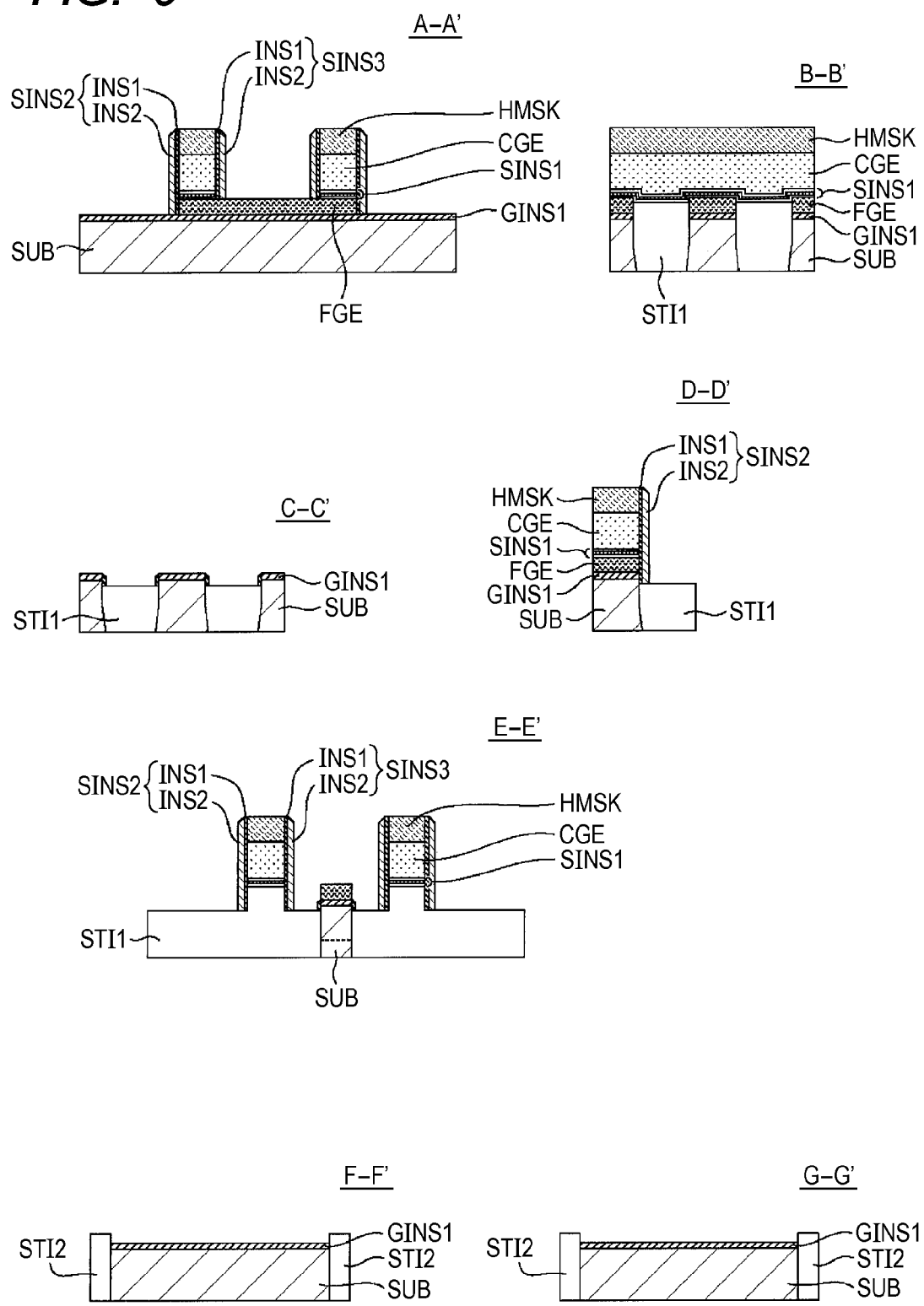
FIG. 9 is cross-sectional views for explaining the manufacturing method of the semiconductor device.

Thereafter, as shown in FIG. 9, the resist pattern PR1 is removed. Subsequently, the insulating film INS1 is formed by a deposition method over the side surface and the upper surface of the two laminated structures, over the side surface of the conductive film to be the floating gate electrode FGE, over a portion located in a region to be the erase gate electrode EGE in the conductive film to be the floating gate electrode FGE, and over a region that is not covered by the conductive film to be the floating gate electrode FGE in the floating gate insulating film GINS1. Subsequently, the insulating film INS1 is anisotropically etched. Thereby, the insulating film INS1 is removed except for a portion located at the side surface of the two laminated structure and a portion located over the side surface of the conductive film to be the floating gate electrode FGE. Although not shown in the drawings, in this process, the region that is not covered by the conductive film to be the floating gate electrode FGE in the floating gate insulating film GINS1 is formed thinner than the region that is covered by the conductive film to be the floating gate electrode FGE by adjusting the etching time and the like.

Subsequently, the insulating film INS2 is formed by a deposition method. In a wet etching process of the insulating film TINS described later, the insulating film INS2 is formed of a material that is more difficult to be etched than the insulating film TINS, for example, a material whose etch selectivity with respect to the insulating film TINS is 10 or more. When the insulating film TINS is a silicon oxide film, the insulating film INS2 is, for example, a silicon nitride film. Subsequently, the insulating film INS2 is anisotropically etched. Thereby, the insulating film INS2 is removed except for a portion located over the insulating film INS1. In this stage, the second insulating film SINS2 and the third insulating film SINS3 are formed.

In the process shown in FIG. 7, the first upper surface SFC1 of the first element isolation film STI1 is lower than the upper surface of the substrate SUB. Thereby, as shown in the D-D' cross-sectional view and the E-E' cross-sectional view in FIG. 9, the lower end of the second insulating film SINS2 is located lower than the upper surface of the substrate SUB.

Figure 10:
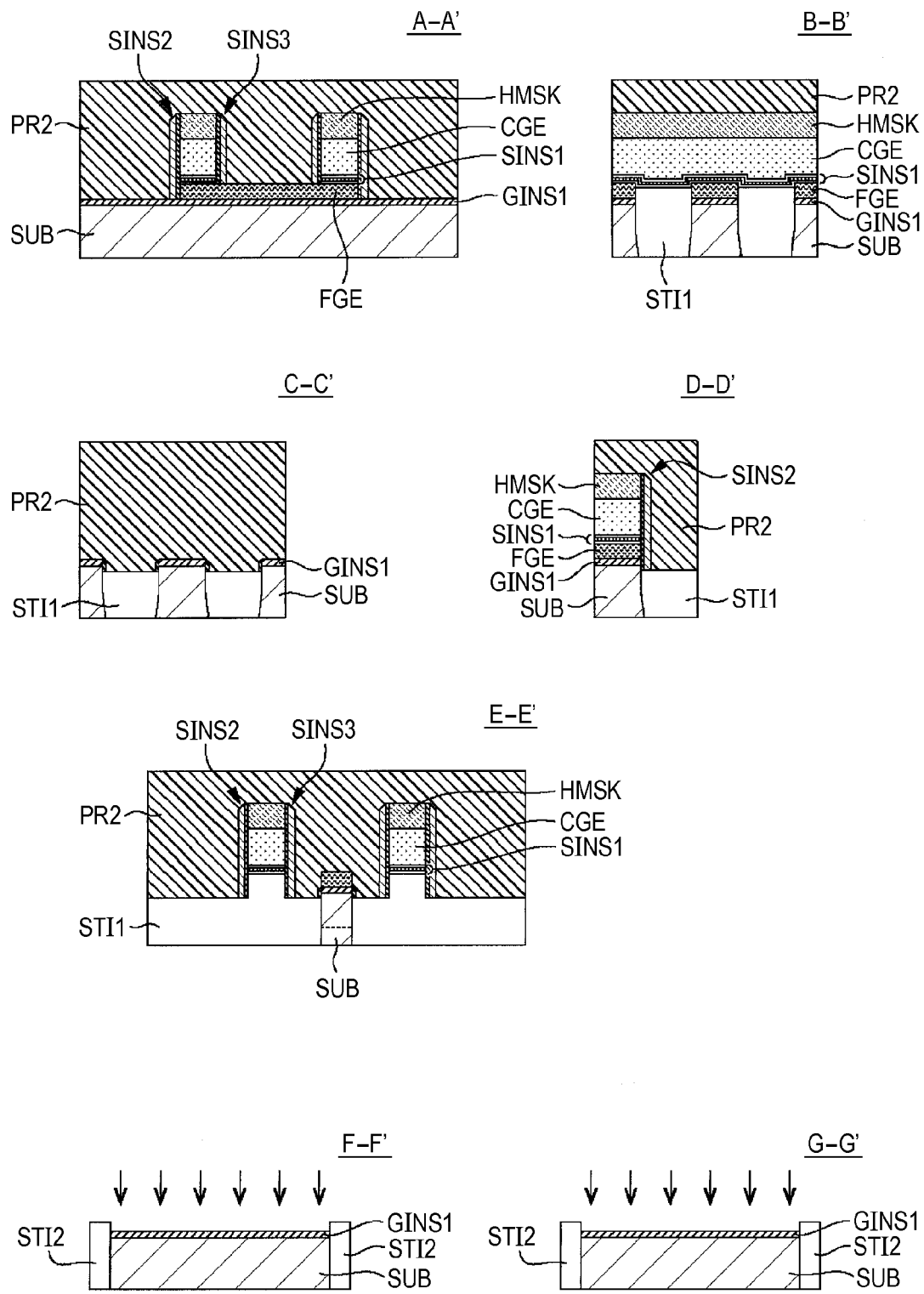
FIG. 10 is cross-sectional views for explaining the manufacturing method of the semiconductor device.

Subsequently, as shown in FIG. 10, the resist pattern PR2 is formed over the substrate SUB. The resist pattern PR2 has an opening over the second element formation region. Subsequently, impurities are injected into the substrate SUB by using the resist pattern PR2 as a mask. Thereby, a well is formed in the substrate SUB located in the second element formation region.

Figure 11:
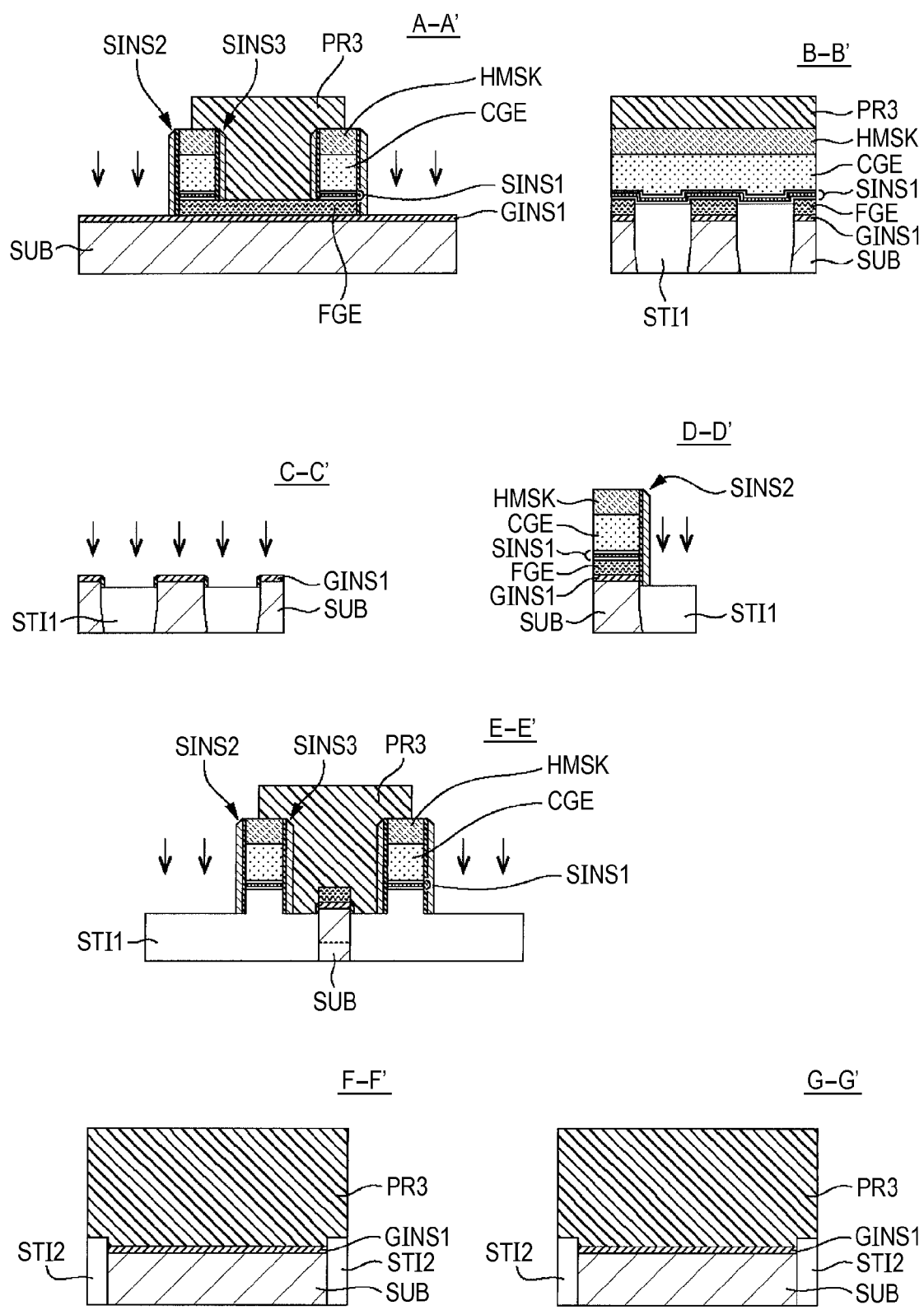
FIG. 11 is cross-sectional views for explaining the manufacturing method of the semiconductor device.

Thereafter, as shown in FIG. 11, the resist pattern PR2 is removed. Subsequently, a resist pattern PR3 is formed over the substrate SUB. The resist pattern PR3 has an opening over the first element formation region. However, the resist pattern PR3 covers a region where the source SOU1 is formed in the substrate SUB. Subsequently, impurities are injected into the substrate SUB by using the resist pattern PR3 as a mask. Thereby, a well is formed in the substrate SUB located in the first element formation region.

Figure 12:
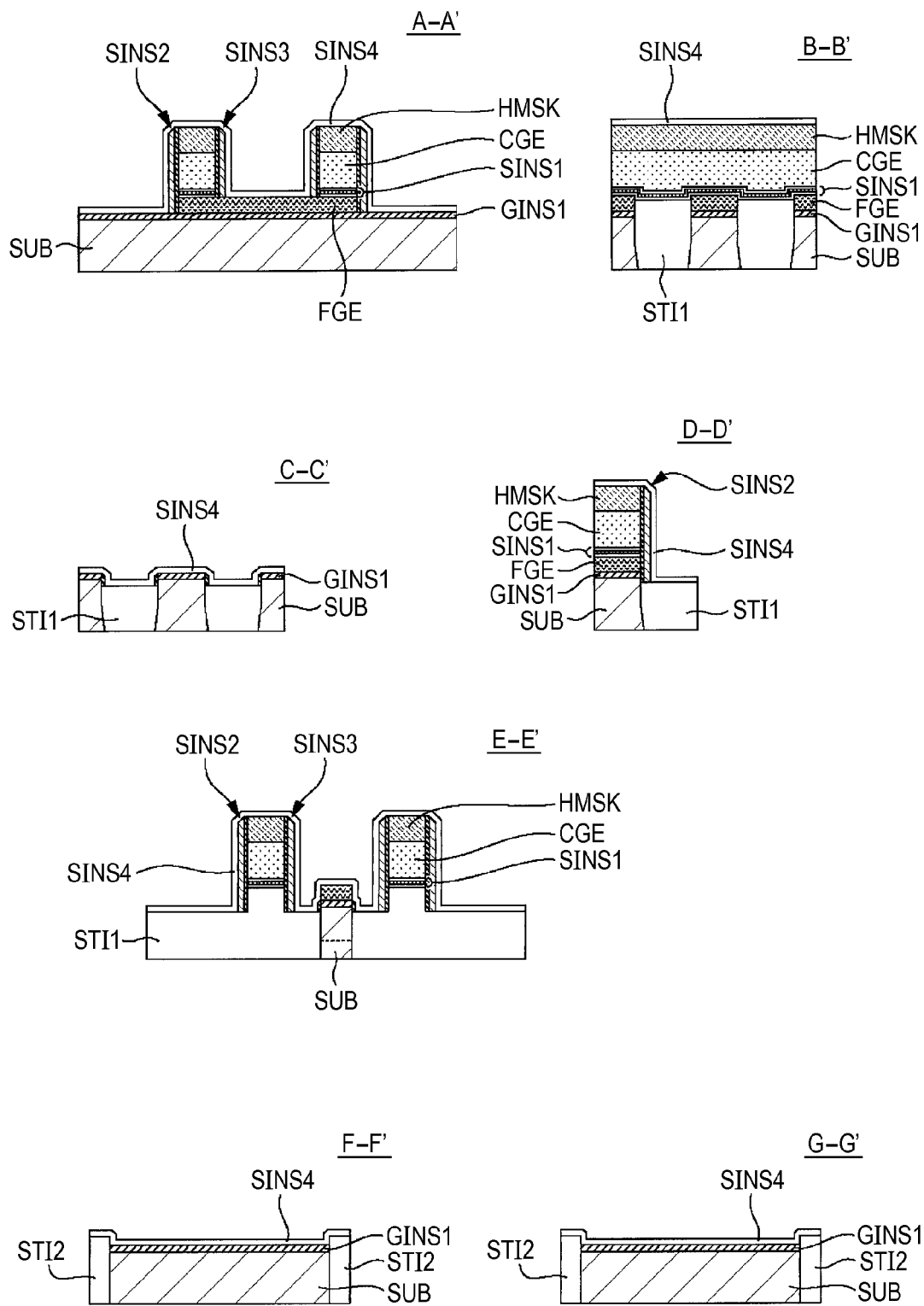
FIG. 12 is cross-sectional views for explaining the manufacturing method of the semiconductor device.

Thereafter, as shown in FIG. 12, the resist pattern PR3 is removed. Subsequently, an insulating film SINS4, for example, a silicon oxide film is formed over the insulating film INS2, over the hard mask HMSK, over the, floating gate insulating film GINS1, and over the conductive film to be the floating gate electrode FGE by, for example, a deposition method.

Figure 13:
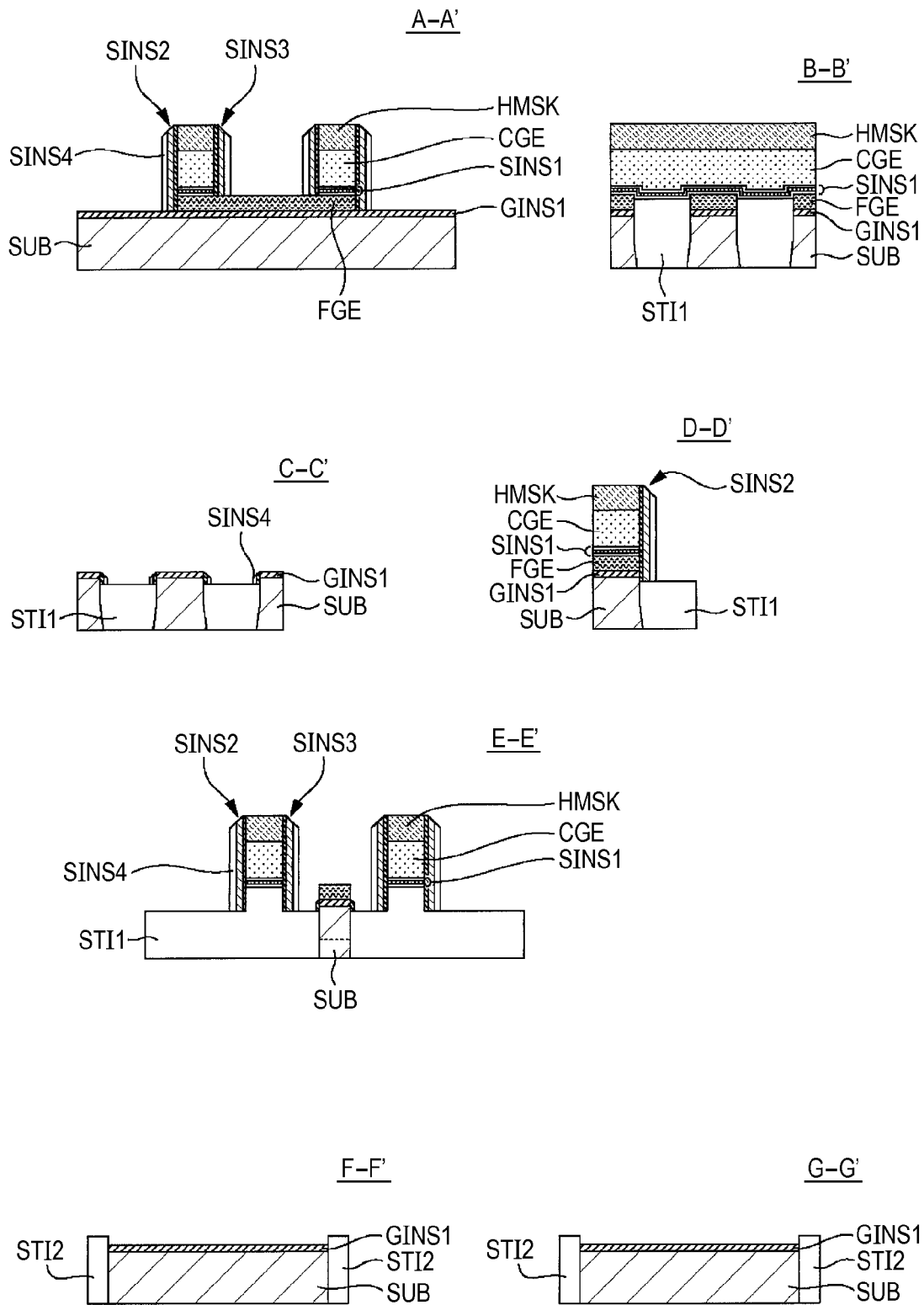
FIG. 13 is cross-sectional views for explaining the manufacturing method of the semiconductor device.

Subsequently, as shown in FIG. 13, the insulating film SINS4 is anisotropically etched. Thereby, the insulating film SINS4 is removed except for a portion located over the insulating film INS2. Although not shown in the drawings, the floating gate insulating film GINS1 not covered by the conductive film to be the floating gate electrode FGE is further thinned in this process.

Figure 14:
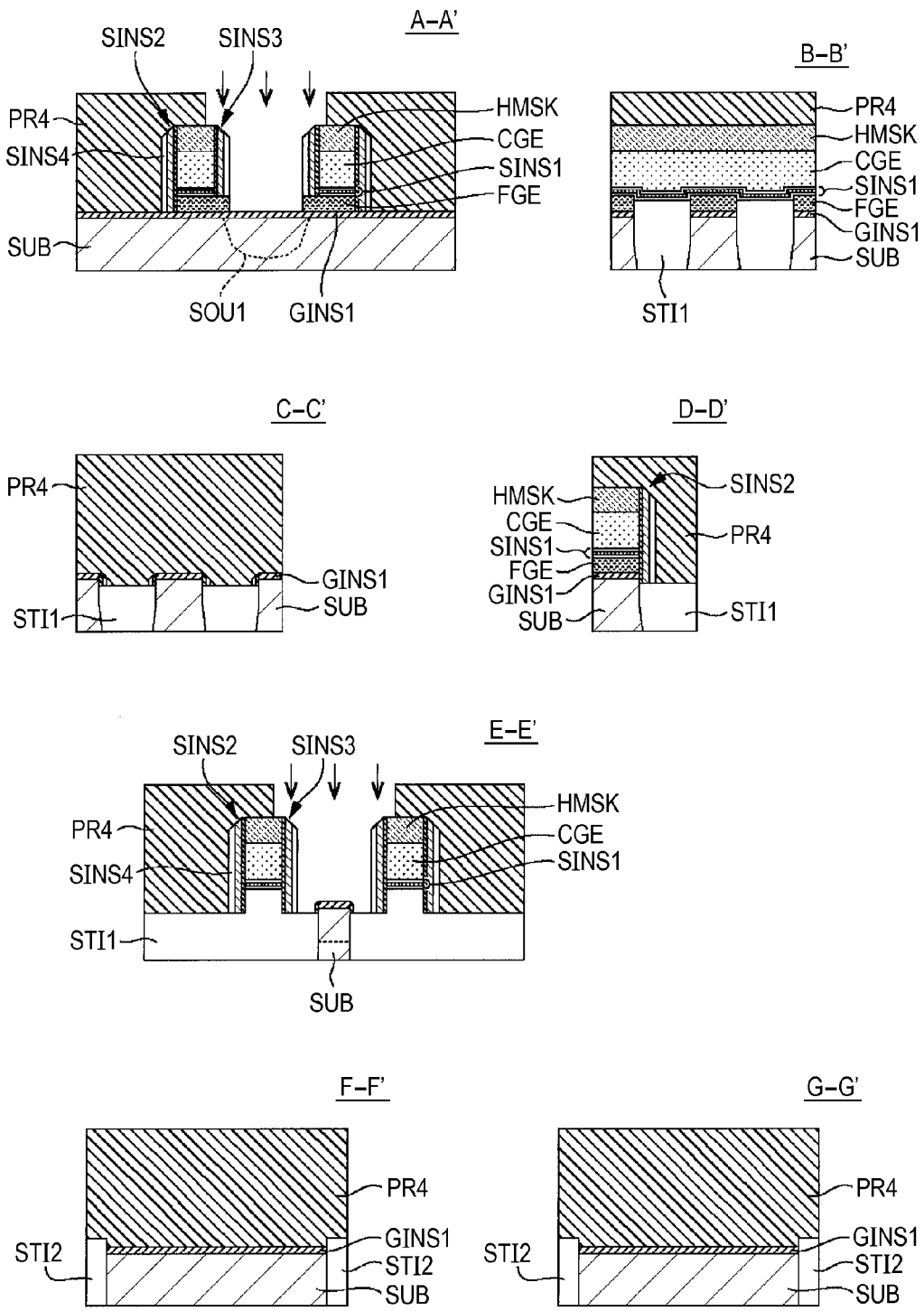
FIG. 14 is cross-sectional views for explaining the manufacturing method of the semiconductor device.

Subsequently, as shown in FIG. 14, the resist pattern PR4 is formed. Subsequently, the conductive film to be the floating gate electrode FGE is anisotropically etched by using the resist pattern PR4 as a mask. Thereby, the floating gate electrode FGE is formed. Subsequently, impurities are injected into the substrate SUB by using the resist pattern PR4 as a mask. Thereby, the source SOU1 is formed in a region located between the two floating gate electrodes FGE in the substrate SUB.

Figure 15:
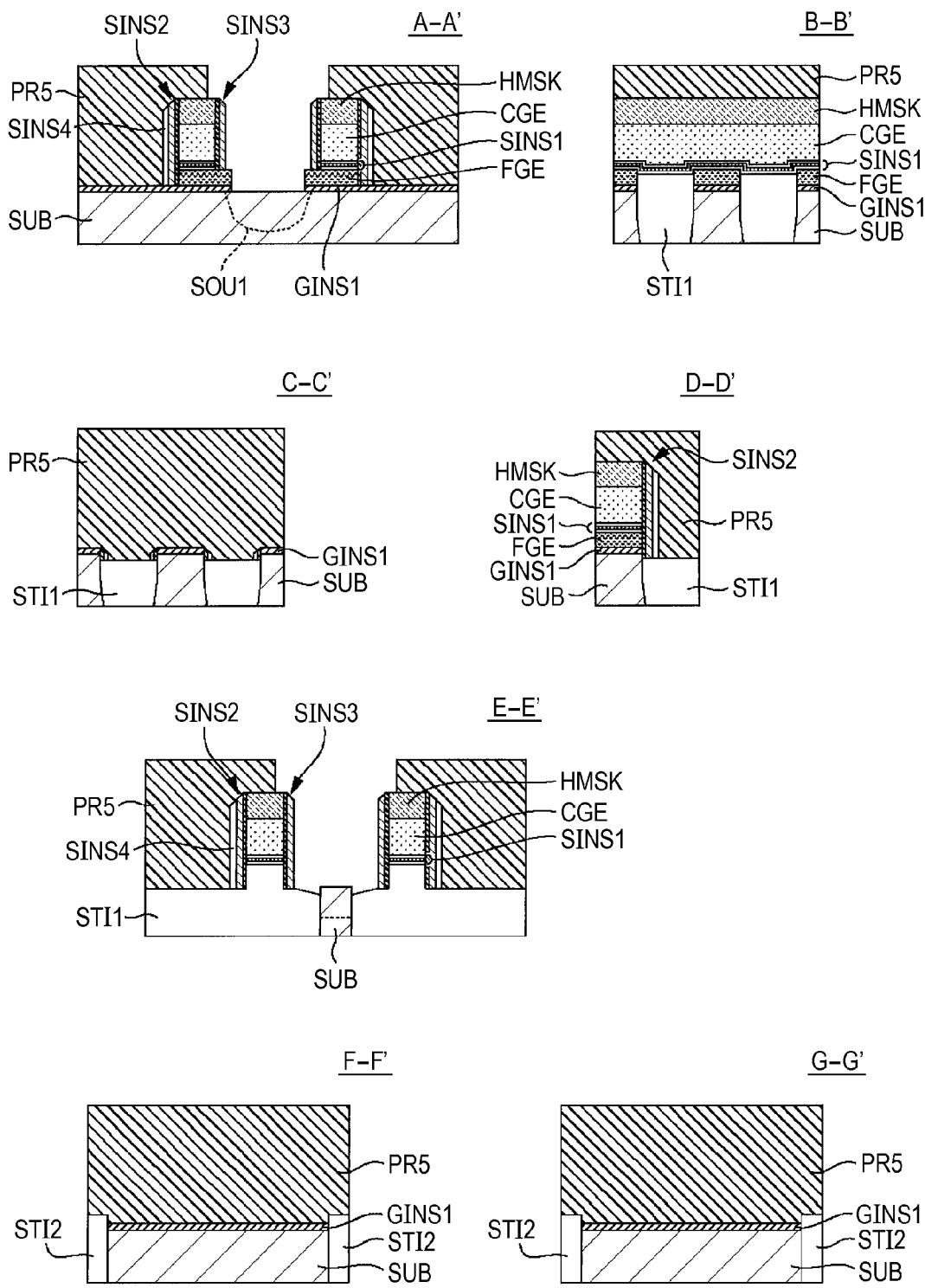
FIG. 15 is cross-sectional views for explaining the manufacturing method of the semiconductor device.

Subsequently, as shown in FIG. 15, the resist pattern PR4 is removed. Subsequently, a resist pattern PR5 is formed and the floating gate insulating film GINS1 located between the two laminated structures is isotropically etched by suing the resist pattern PR5 as a mask. Thereby, the floating gate insulating film GINS1 is divided into two parts.

In this process, the insulating film SINS4 located between the two laminated structures is removed. Further, as shown in the E-E' cross-sectional view in FIG. 15, in this process, a portion located between the two laminated structures in the first element isolation film STI1 is etched.

Figure 16:
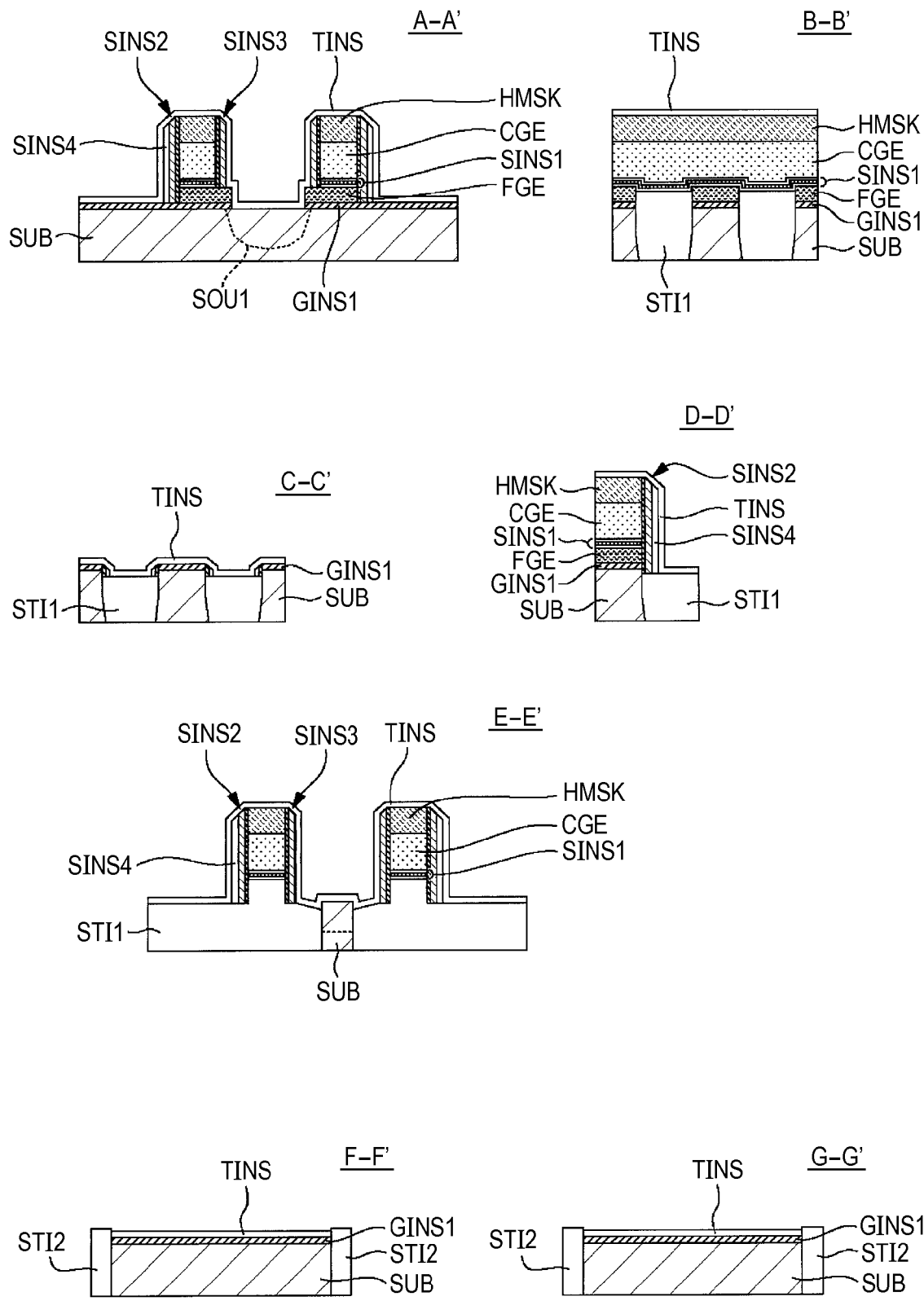
FIG. 16 is cross-sectional views for explaining the manufacturing method of the semiconductor device.

Subsequently, as shown in FIG. 16, the insulating film TINS is formed by a deposition method over the side surface and the upper surface of the two laminated structures, over the floating gate insulating film GINS1, and over a region where the source SOU1 is formed in the substrate SUB. The insulating film TINS is, for example, a silicon oxide film, and the thickness of the insulating film TINS is, for example, greater than or equal to 7 nm and smaller than or equal to 17 nm.

Figure 17:
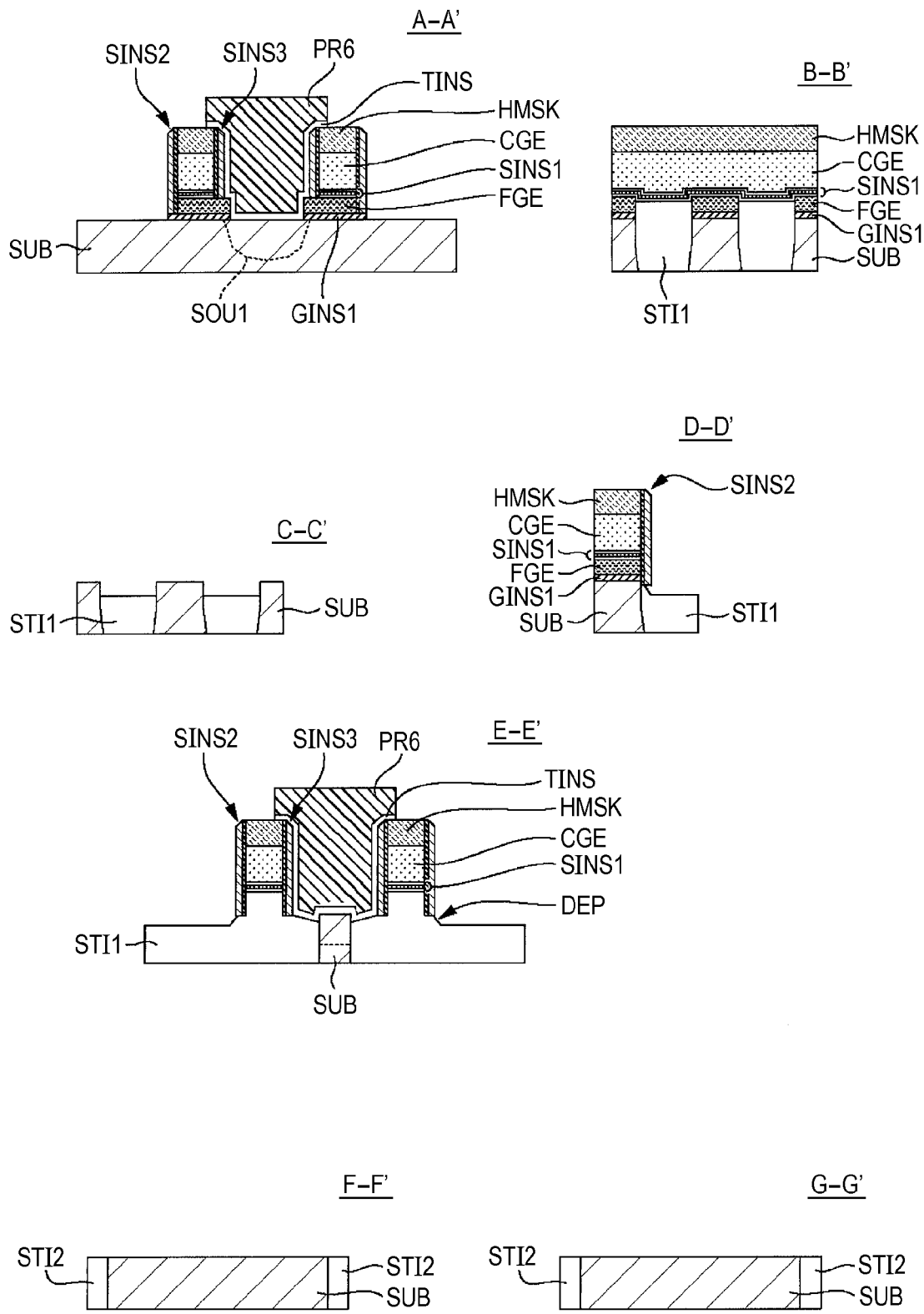
FIG. 17 is cross-sectional views for explaining the manufacturing method of the semiconductor device.

Subsequently, as shown in FIG. 17, a portion between the two laminated structures is covered by the resist pattern PR6. At this time, the resist pattern PR6 covers over a part of the hard mask HMSK. Subsequently, the insulating film TINS is wet etched by using the resist pattern PR6 as a mask. The etchant used at this time is, for example, BHF (buffered hydrogen fluoride). Thereby, a portion of the insulating film TINS located over the floating gate insulating film GINS1 and a portion of the insulating film TINS located over the side surfaces of the laminated structures which do not face each other are removed.

In this process, a portion of the floating gate insulating film GINS1, which is not covered by the floating gate electrode FGE, is removed. Further, a portion of the insulating film SINS4, which is located over the second insulating film SINS2, is also removed. Further, as shown in the C-C' cross-sectional view, the D-D' cross-sectional view, and the E-E' cross-sectional view in FIG. 17, a portion of the first element isolation film STI1 (for example, the first upper surface SFC1), which is exposed, is etched and depressed. Further, a portion of the first element isolation film STI1, which faces the lower end of the second insulating film SINS2, is etched and a depressed portion DEP is formed.

Figure 18:
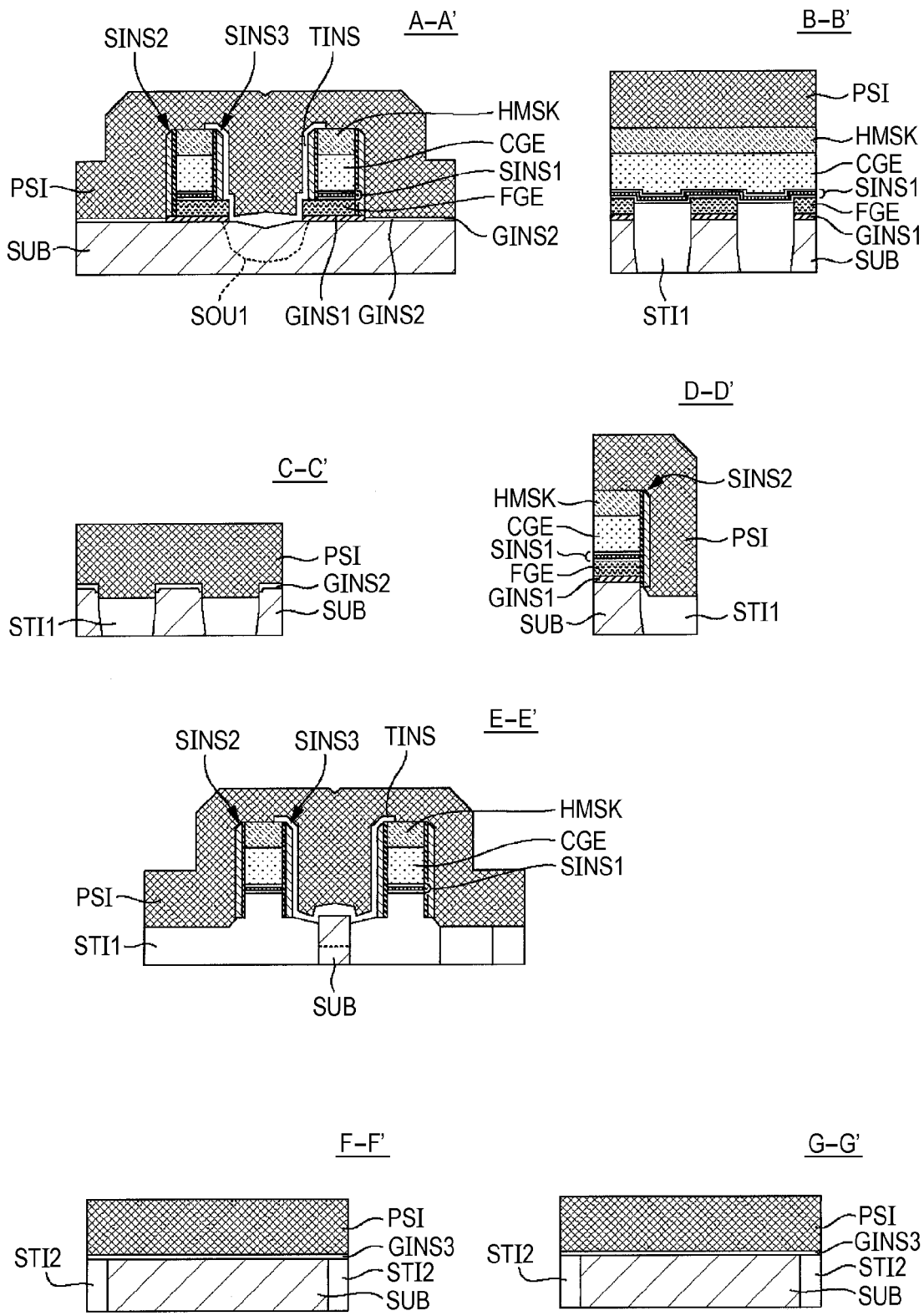
FIG. 18 is cross-sectional views for explaining the manufacturing method of the semiconductor device.

Subsequently, as shown in FIG. 18, the resist pattern PR6 is removed. Subsequently, the selection gate insulating film GINS2 is formed by thermally oxidizing the substrate SUB. The selection gate insulating film GINS2 is also formed below the insulating film INS2.

Subsequently, a conductive film PSI, for example, a polysilicon film is formed between the two laminated structures and over the selection gate insulating film GINS2. At this time, the conductive film PSI is also formed in the depressed portion DEP.

Figure 19:
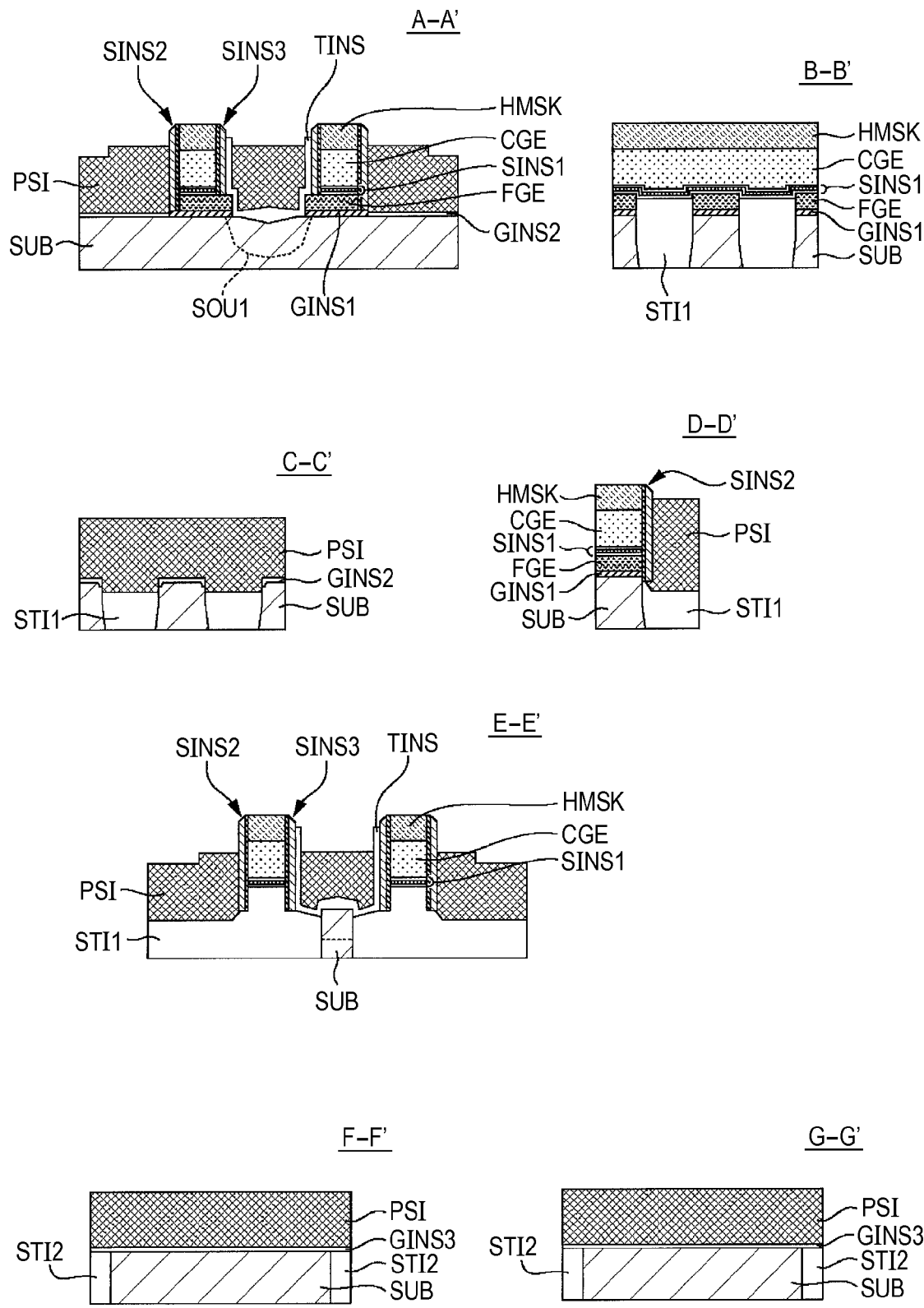
FIG. 19 is cross-sectional views for explaining the manufacturing method of the semiconductor device.

Subsequently, as shown in FIG. 19, the conductive film PSI is flattened. The flattening is performed by, for example, an etch back method.

Figure 20:
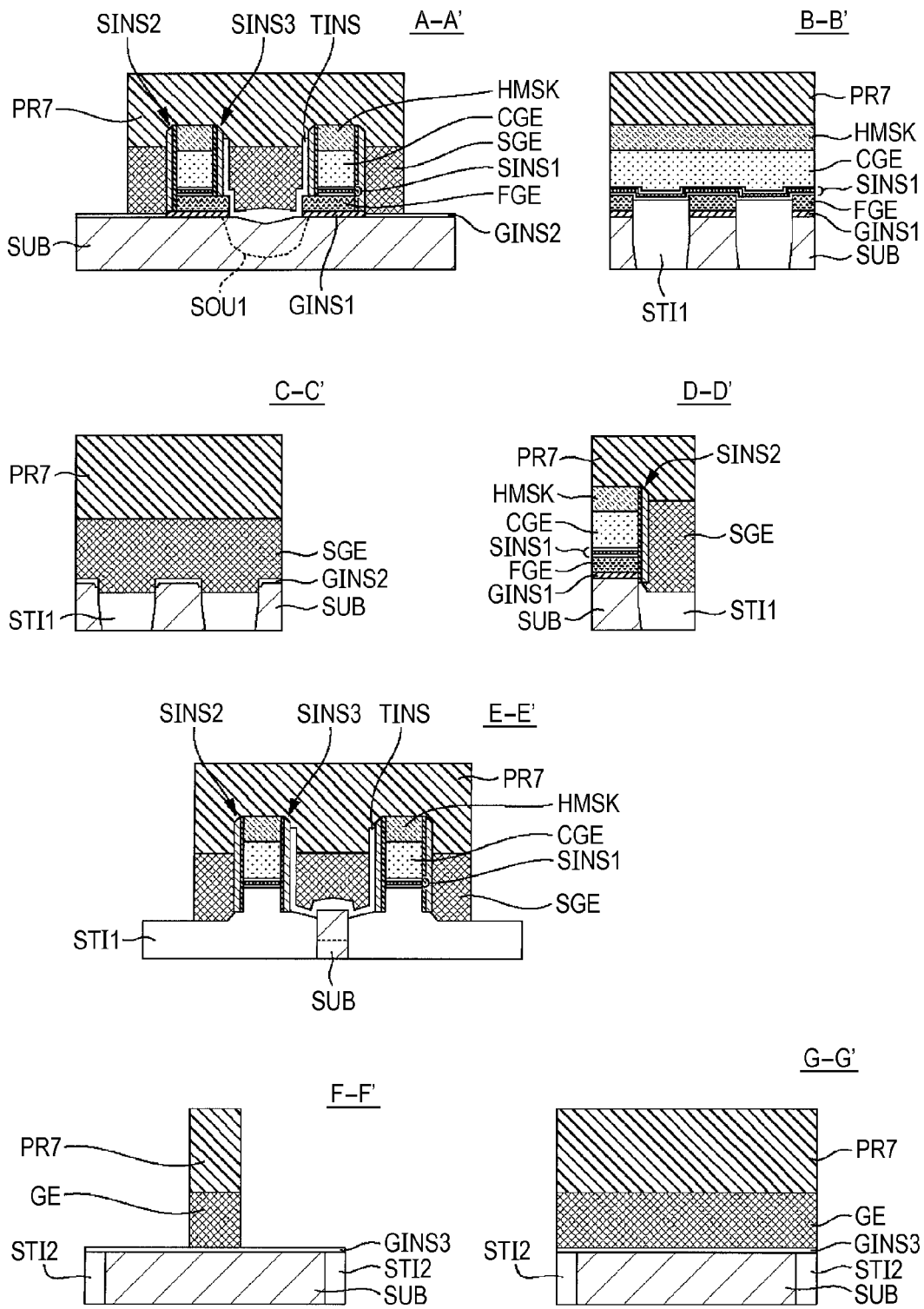
FIG. 20 is cross-sectional views for explaining the manufacturing method of the semiconductor device.

Subsequently, as shown in FIG. 20, the resist pattern PR7 is formed over the conductive film and anisotropic etching is performed on the conductive film by using the resist pattern PR7 as a mask. Thereby, the selection gate electrode SGE is formed over the selection gate insulating film GINS2. The erase gate electrode EGE is formed between the two laminated structures. Further, the gate electrode GE is formed over the second element formation region and the second element isolation film STI2.

Here, if the process shown in FIG. 7 is not performed, the first upper surface SFC1 of the first element isolation film STI1 is located higher than or equal to the upper surface of the substrate SUB. Therefore, the lower end of the second insulating film SINS2 is located higher than or equal to the upper surface of the substrate SUB. In this case, the distance between the depressed portion DEP and the floating gate electrode FGE is small. In this case, a part of the selection gate electrode SGE enters into the depressed portion DEP, so that the selection gate electrode SGE is close to the floating gate electrode FGE and a withstand voltage between these electrodes decreases.

On the other hand, in the present embodiment, the first upper surface SFC1 of the first element isolation film STI1 is lower than the upper surface of the substrate SUB in the process shown in FIG. 7, so that the lower end of the second insulating film SINS2 is located lower than the upper surface of the substrate SUB. Therefore, even when a part of the selection gate electrode SGE enters into the depressed portion DEP, it is possible to prevent the selection gate electrode SGE from being close to the floating gate electrode FGE. Therefore, the withstand voltage between the selection gate electrode SGE and the floating gate electrode FGE from decreasing.

Thereafter, impurity ions are injected into the substrate SUB. Thereby, the low density impurity region LDR is formed. Subsequently, an insulating film (for example, a silicon oxide film) to be the side wall SW is formed over the substrate SUB and the insulating film is etched back. Thereby, the side wall SW is formed. In this process, a surface layer of a region adjacent to the drain DRN1 in the first element isolation film STI1 (that is, a region that is not covered by the side wall SW and the like) and a surface layer of the second element isolation film STI2 are removed. However, the upper surface of the second element isolation film STI2 is still located higher than the first upper surface SFC1 of the first element isolation film STI1. On the other hand, the second upper surface SFC2 of the first element isolation film STI1 is covered by the floating gate electrode FGE and the like, so that the second upper surface SFC2 of the first element isolation film STI1 is not etched.

Subsequently, impurity ions are injected into the substrate SUB. Thereby, the drain DRN1, the source SOU2, and the drain DRN2 are formed. Subsequently, the insulating film ESI, the interlayer insulating film INSL, and each contact are formed.

As described above, according to the present embodiment, in the process shown in FIG. 7, the first upper surface SFC1 of the first element isolation film STI1 is lower than the upper surface of the substrate SUB, so that the lower end of the second insulating film SINS2 is located lower than the upper surface of the substrate SUB. Therefore, the depressed portion DEP is formed in a portion facing the lower end of the second insulating film SINS2 in the first element isolation film STI1, so that even when the selection gate electrode SGE enters into the depressed portion DEP, it is possible to ensure a distance between the selection gate electrode SGE and the floating gate electrode FGE and to prevent the withstand voltage between these electrodes from decreasing.

As described in FIG. 3, the upper surface of the second element isolation film STI2 in the peripheral circuit region CIR is higher than the first upper surface SFC1 of the first element isolation film STI1. The upper surface of a region of the second element isolation film STI2 overlapping with the gate electrode GE is higher than the first upper surface SFC1 of the first element isolation film STI1 and is lower than the second upper surface SFC2. In the present embodiment, the first upper surface SFC1 of the first element isolation film STI1 is positively depressed. In the peripheral circuit region CIR, if the upper surface of the second element isolation film STI2 is as low as the first upper surface SFC1 of the first element isolation film STI1, the upper surface of the second element isolation film STI2 is close to a bottom portion of a diffusion layer to be a source/drain region. In particular, the upper surface of the second element isolation film STI2 may be lower than the bottom portion of the diffusion layer to be the source/drain region. In that case, when a silicide is formed in the source/drain region, there is a risk that the silicide comes into contact with the substrate SUB. In the present embodiment, to avoid such a defect, the height of the upper surface of the second element isolation film STI2 is ensured in the peripheral circuit region CIR.

While the invention made by the inventors has been specifically described based on the embodiment, the invention is not limited to the embodiment, but needless to say that the invention may be modified in various ways without departing from the scope of the invention.

What is claimed is:

1. A semiconductor device comprising:
    a substrate;
    a first element isolation film which is formed in the substrate and is located adjacent to a first element formation region of the substrate;
    a floating gate insulating film formed over the substrate located in the first element formation region;
    a floating gate electrode formed over the floating gate insulating film;
    a control gate electrode formed over the floating gate electrode via a first insulating film;
    a selection gate insulating film which is formed over the substrate located in the first element formation region and is located adjacent to the floating gate insulating film;
    a selection gate electrode which is continuously formed over the selection gate insulating film and the first element isolation film and whose side surface is in contact with a first side surface of the floating gate electrode through a second insulating film; and
    an erase gate electrode that is in contact with a second side surface of the floating gate electrode through a third insulating film,
    wherein a first upper surface, which is an upper surface of a region overlapping with the selection gate electrode in the first element isolation film, is located lower than an upper surface of the substrate.

2. The semiconductor device according to claim 1,
    wherein a lower end of the second insulating film is located lower than the upper surface of the substrate.

3. The semiconductor device according to claim 2,
    wherein a distance from the lower end of the second insulating film to a bottom surface of the floating gate electrode is greater than a thickness of the second insulating film.

4. The semiconductor device according to claim 1,
    wherein the first upper surface is located lower than a second upper surface which is an upper surface of a region overlapping with the control gate electrode in the first element isolation film.

5. The semiconductor device according to claim 4, further comprising:
    a second element isolation film which is formed in the substrate and is located adjacent to a second element formation region; and
    a transistor formed in the second element formation region,
    wherein a part of a gate electrode of the transistor is located over the second element isolation film, and
    wherein an upper surface of a region overlapping with the gate electrode in the second element isolation film is higher than the first upper surface and lower than the second upper surface.

6. The semiconductor device according to claim 1, further comprising:
    a second element isolation film which is formed in the substrate and is located adjacent to a second element formation region; and
    a transistor formed in the second element formation region,
    wherein an upper surface of the second element isolation film is located higher than the first upper surface.

* * * * *